(12) United States Patent
Braune et al.

(10) Patent No.: US 7,256,428 B2
(45) Date of Patent: Aug. 14, 2007

(54) OPTOELECTRONIC COMPONENT AND METHOD FOR THE PRODUCTION THEREOF

(75) Inventors: Bert Braune, Wenzenbach (DE); Patrick Kromotis, Regensburg (DE)

(73) Assignee: Osram Opto Semicondutors GmbH, Regensburg (DE)

( * ) Notice: Subject to any disclaimer, the term of this patent is extended or adjusted under 35 U.S.C. 154(b) by 243 days.

(21) Appl. No.: 10/481,528

(22) PCT Filed: Jun. 19, 2002

(86) PCT No.: PCT/DE02/02232

§ 371 (c)(1),
(2), (4) Date: Aug. 23, 2004

(87) PCT Pub. No.: WO03/001253

PCT Pub. Date: Jan. 3, 2003

(65) Prior Publication Data

US 2005/0001228 A1 Jan. 6, 2005

(30) Foreign Application Priority Data

Jun. 20, 2001 (DE) ................................ 101 29 785

(51) Int. Cl.
*H01L 33/00* (2006.01)
*H01L 29/24* (2006.01)

(52) U.S. Cl. .............................. 257/100; 257/E33.059; 257/E33.067

(58) Field of Classification Search .................. 257/98, 257/100, 433, 99; 438/64, 69
See application file for complete search history.

(56) References Cited

U.S. PATENT DOCUMENTS 4,822,536 A    4/1989 Voinis et al.
4,843,280 A    6/1989 Lumbard et al.
5,513,289 A    4/1996 Hosokawa et al.
6,037,043 A    3/2000 Lehner et al.

(Continued)

FOREIGN PATENT DOCUMENTS

DE    196 38 630    4/1998

(Continued)

OTHER PUBLICATIONS

F. Möllmer and G. Waitl, "Siemens SMT-Topled für die Oberflächenmontage" ["Siemens SMT-Topled for surface mounting"], Siemens Components 29 (1991), Issue 4, pp, 147-149.

(Continued)

*Primary Examiner*—David A. Zarneke
(74) *Attorney, Agent, or Firm*—Cohen Pontani Lieberman & Pavane LLP

(57) ABSTRACT

In order to apply an optical element such as a lens, for example, to an optoelectronic component, the surface (3B), averted from the transmitter or receiver (2), of the filling material (3) is designed directly with a lens profile (7). This is done by filling a defined quantity of the transparent filling material (3) into the recess (1A) of the carrier body (1) for the purpose of embedding the transmitter or receiver (2), and by subsequently impressing a lens profile (7) onto the surface (3B), averted from the transmitter or receiver, of the transparent filling material (3) by means of a punch (8), before the transparent filling material with the lens profile (7) thus impressed is completely cured.

13 Claims, 2 Drawing Sheets

U.S. PATENT DOCUMENTS

| | | |
|---|---|---|
| 6,060,729 A * | 5/2000 | Suzuki et al. .................. 257/99 |
| 6,610,563 B1 | 8/2003 | Waitl et al. |
| 6,987,613 B2 * | 1/2006 | Pocius et al. ............... 359/565 |
| 7,098,485 B2 * | 8/2006 | Isokawa ...................... 257/98 |
| 2002/0057057 A1 | 5/2002 | Sorg |
| 2003/0185526 A1 | 10/2003 | Hohn et al. |

FOREIGN PATENT DOCUMENTS

| | | |
|---|---|---|
| DE | 197 46 893 | 5/1999 |
| DE | 197 55 734 A1 | 6/1999 |
| DE | 199 18 370 A1 | 11/2000 |
| DE | 100 23 353 A1 | 11/2001 |
| EP | 0 230 078 | 7/1987 |
| FR | 2 617 664 | 1/1989 |
| JP | 62 196878 A | 8/1987 |
| JP | 05-145121 | 6/1993 |
| JP | 5-145121 | 6/1993 |
| JP | 06-334220 | 12/1994 |
| JP | 2000-216443 | 8/2000 |
| JP | 2002-216443 | 8/2000 |
| JP | 2001-28456 | 1/2001 |
| WO | WO 00 24062 A | 4/2000 |
| WO | WO 00/65664 | 11/2000 |

OTHER PUBLICATIONS http;//www.ise.fhg.de/Press_info/pi0100_german.html and English translation.

www.messe-stuttgart.de/ww/download/ne_5.doc and English translation.

* cited by examiner

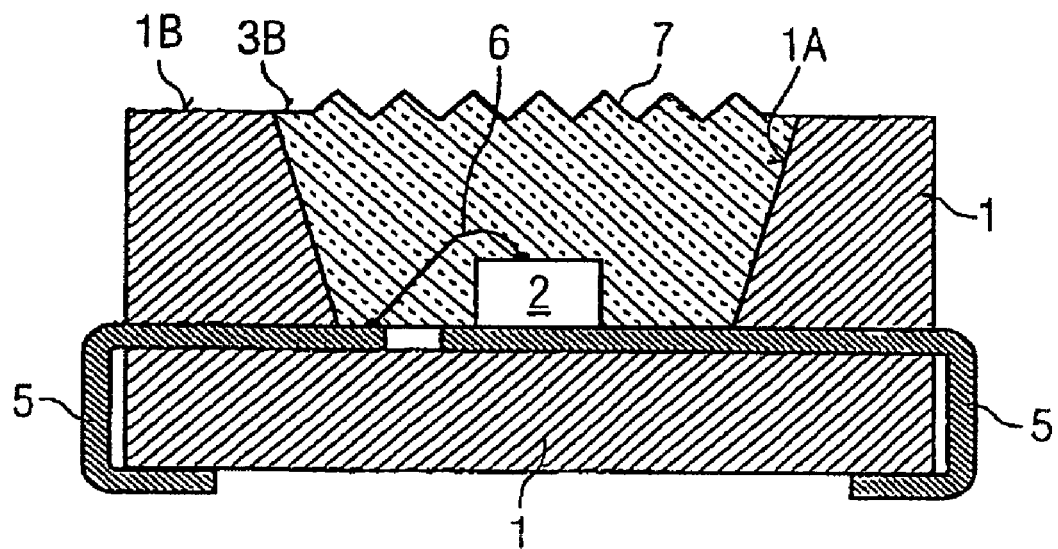
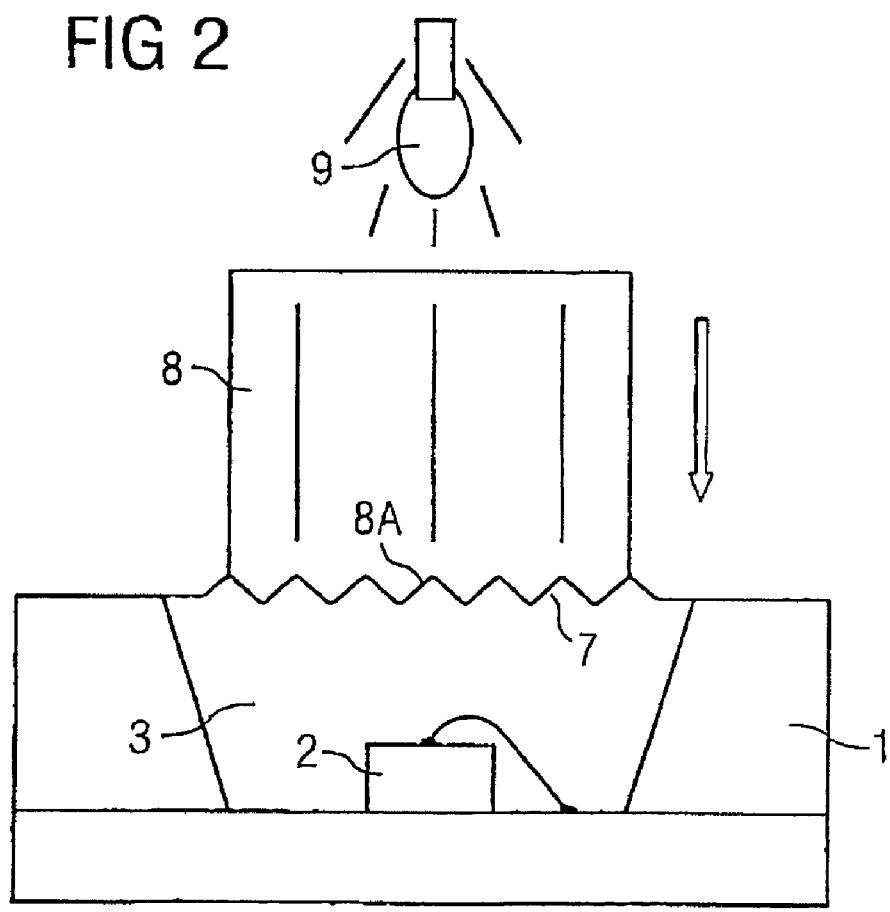

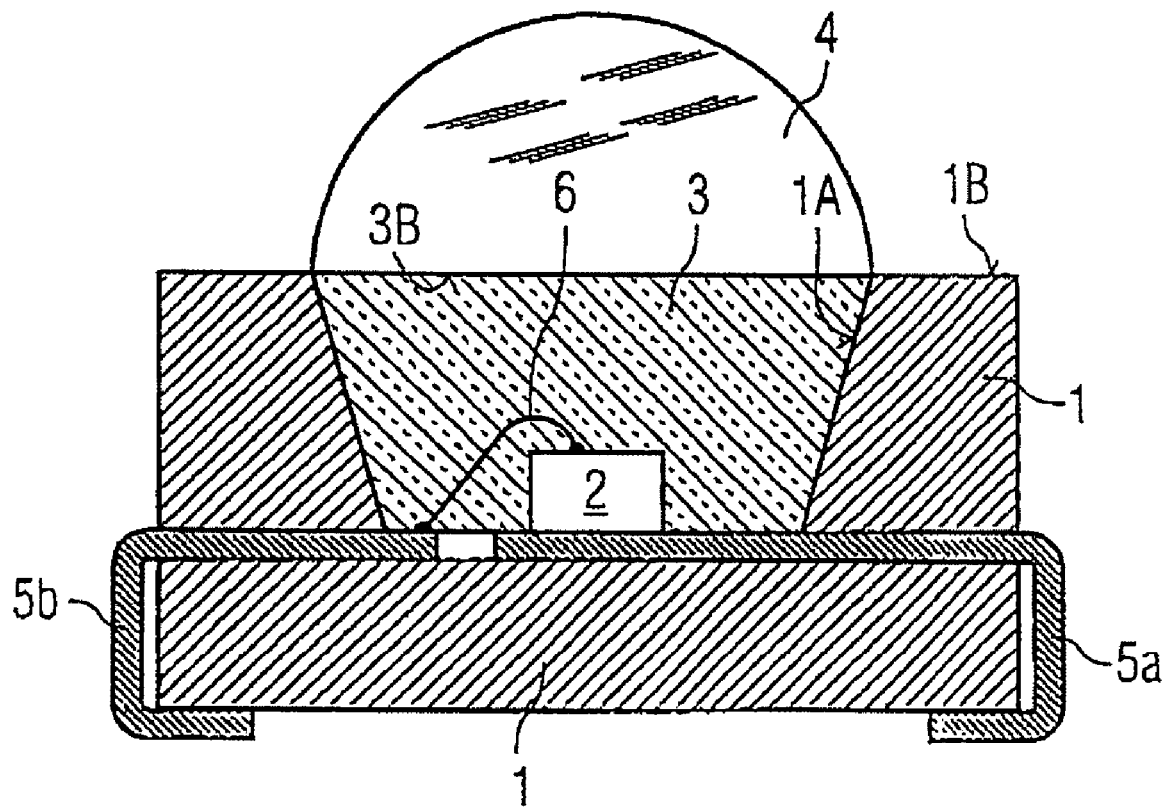

OPTOELECTRONIC COMPONENT AND METHOD FOR THE PRODUCTION THEREOF

This is a U.S. national stage of International application No. PCT/DE02/02232 filed on Jun. 19, 2002.

This patent application claims the priority of German patent application no. 10129785.8 dated 20 Jun. 2001, the disclosure of which is hereby incorporated by reference.

FIELD OF THE INVENTION

The present invention relates to an optoelectronic component having a carrier body, an optoelectronic transmitter or receiver arranged in a recess in the carrier body, and a filling, embedding the optoelectronic transmitter or receiver in the recess in the carrier body, made from a transparent material, as well as to a method for producing such an optoelectronic component.

BACKGROUND OF THE INVENTION

An example of such an optoelectronic component is illustrated in FIG. 3. The design shown in FIG. 3 is described in more detail in, for example, the article entitled "SIEMENS SMT-TOPLED für die Oberflächenmontage" [SIEMENS SMT-TOPLED for surface mounting] by F. Möllmer and G. Waitl in the journal Siemens Components 29 (1991), Issue 4, pages 147–149, and illustrates an optoelectronic component produced using surface mounting technology (SMT).

An optoelectronic transmitter such as an LED 2, for example, is mounted with one of its electrical contact surfaces on a conductor ribbon 5a that is connected to a pole of a voltage source, while an opposite conductor ribbon 5b, connected to the other pole of the voltage source, is connected to the other electrical contact surface of the LED 2 by a bonding wire 6. A carrier body 1 made from a high temperature resistant thermoplastic is formed by injection molding about the conductor ribbons 5a, 5b, there being formed in the carrier body 1 a recess 1A into which the LED 2 arranged on the conductor ribbon 5a projects. The recess 1A of the carrier body 2 is filled with a transparent filling material 3 in order to embed the LED 2 therein protectively.

In order to change the radiation characteristics an optical element such as, for example a lens 4 is, as illustrated in FIG. 3, arranged on the surface 3B of the filling material 3 which levels with the surface 1B of the carrier body 1. Various methods are already known from the prior art for applying the lens 4 to the optoelectronic component.

In a known method of production, the optical element is also applied when casting the LED with the transparent filling material by means of an appropriate mold. An optoelectronic component produced using this method is described, for example, in U.S. Pat. No. 4,843,280, even though no details are given there of the formation of the filling material with the aid of different lens shapes. However, there are disadvantages in simultaneously applying the lens shape when casting with the transparent material, and these reside, in particular, in the removal from the mold and in the forces that act on the contact made with the conductor ribbons. These forces are produced by the relatively large quantity of filling material, which also exerts higher forces on the contacts during thermal stress.

A further method of production for optoelectronic components described above includes firstly casting the recess of the carrier body with the transparent filling material, and subsequently applying the optical element separately to the surface of the filling material. Examples of such methods are described in more detail, for example, in DE 197 55 734 A1 and DE 199 18 370 A1. However, it is a disadvantage of this method that an additional process step of applying the lens is required, and that the method is sensitive to high tolerances during flat casting of the filling material and/or during placing of the lenses and with reference to the adhesion of the lenses on the transparent filling material.

SUMMARY OF THE INVENTION

It is therefore an object of the present invention to provide an opoelectronic component and a method for producing it in which the application of an optical element can be carried out simply in a cost-effective and accurately fashion.

This and other objects are attained in accordance with one aspect of the present invention directed to an optoelectronic component, having a carrier body with a recess. An optoelectronic transmitter or receiver is arranged in the recess on the carrier body. A filling which is made from a transparent material embeds the optoelectronic transmitter or receiver in the recess of the carrier body. The surface, averted from the transmitter or receiver, of the filling is designed with a lens profile.

Another aspect of the present invention is directed to a method for producing an optoelectronic component having a carrier body with a recess. An optoelectronic transmitter or receiver is arranged in the recess on the carrier body. The recess is formed in the carrier body and the transmitter or receiver is mounted in the recess thus formed. A defined quantity of a transparent filling material is injected into the recess for the purpose of embedding the transmitter or receiver. A lens profile is impressed on the surface, averted from the transmitter or receiver, of the transparent filling material. The transparent filling material is cured with the surface having the lens profile.

The invention proposes also designing the surface of the filling itself, averted from the transmitter or receiver, with a lens profile. This is done according to the invention by filling a defined quantity of the transparent filling material into the recess for the purpose of embedding the transmitter or receiver, and by subsequently impressing a lens profile on the surface, averted from the transmitter or receiver, of the transparent filling material, before the transparent filling material with the lens profile thus impressed is cured.

An additional process step of bonding on an optical element is rendered superfluous with the aid of the invention. Moreover, impressing a lens shape directly into the surface of the transparent filling material is less problematical than casting an LED with integrated lens in the way described at the beginning.

The lens profile is preferably impressed onto the surface, averted from the transmitter or receiver, of the transparent filling material by means of a punch that has a punch face corresponding to the lens profile.

In a preferred embodiment of the invention, the method step of impressing the lens profile is subdivided into the following steps: pressing the punch with the punch face onto the surface of the transparent filling material to form the lens profile; incipiently curing the transparent filling material with the lens profile thus formed; and lifting the punch off from the incipiently cured transparent filling material. In order to facilitate lifting off the punch from the surface of the transparent filling material, the punch face of the punch can have a coating made from a material that has non-stick properties with reference to the filling material.

It is also advantageous when the punch comprises a transparent material and the filling material includes a transparent, cationically curable, UV-initiated or light-initiated material. In this case, the above method step of incipiently curing the filling material with lens profile can be performed by applying the UV or light radiation to the filling material through the punch, the effect of this curing mechanism being, in particular, that epoxy resins are transformed into a gel phase that already permits prefixing. The incipient curing can take place in this case within a few seconds. It is even possible to excite the incipient curing only with the aid of a short light or UV flash. After this short incipient curing phase, the punch can be lifted off, and the lens profile can subsequently be finally fixed at raised temperatures by postcuring.

BRIEF DESCRIPTION OF THE DRAWINGS

A preferred exemplary embodiment of the optoelectronic component according to the invention, and of its method of production is explained below in more detail with reference to the attached drawings, in which:

FIG. 1 shows a schematic sectional illustration of an optoelectronic component in accordance with the present invention;

FIG. 2 shows a schematic illustration for explaining a method for producing the optoelectronic component of FIG. 1 in accordance with the present invention; and FIG. 3 shows a schematic sectional illustration of a conventional optoelectronic component.

DETAILED DESCRIPTION OF THE PRESENTLY PREFERRED EMBODIMENTS

A schematic cross-sectional view of an optoelectronic component in accordance with a preferred exemplary embodiment of the invention is illustrated in FIG. 1. The basic body for the component is formed by encapsulating a conductor ribbon 5 by injection molding with the aid of a high temperature resistant thermoplastic, resulting in the formation of a carrier body 1. The carrier body 1 has a central recess 1A in which an optoelectronic transmitter or receiver such as an LED 2, for example, is arranged and electrically connected to the conductor ribbon 5.

The inner surfaces of the recess 1A of the carrier body 1 are preferably of oblique design, as shown in FIG. 1. By selecting a suitable material for the carrier body 1 with a high diffuse reflection factor, these oblique inner surfaces act as reflectors in order to increase the emitted power or the reception sensitivity of the optoelectronic component. A suitable material is thermoplastic material filled with Titanium Oxide particles.

The optoelectronic transmitter or receiver 2 is embedded in a transparent filling material 3. The surface 3B of the filling material 3 averted from the transmitter or receiver 2 in this case substantially forms a seal with the surface 1B of the carrier body 1. It is pointed out that, depending on what is required it is, of course, also possible within the scope of the invention to select other filling heights of the filling material 3 in the recess 1A of the carrier body 1.

Furthermore, the surface 3B of the filling material 3 averted from the transmitter or receiver 2 is provided with a lens profile 7 that is introduced directly into the filling material 3. A Fresnel lens is illustrated in greatly simplified form in the illustration of FIG. 1 as an example of a lens profile 7. However, the invention is not restricted to the lens shape 7 illustrated in FIG. 1; in principle, the surface 3B of the filling material 3 can be designed with any desired lens shapes.

A transparent material that preferably has cationically curable, UV-initiated or light-initiated properties is used as material for the filling material 3. A particularly preferred filling material 3 contains a cationically curable, UV-initiated or light-initiated epoxy resin. Such a filling material 3 can be incipiently cured and prefixed within a few seconds by applying light or UV radiation, and be completely cured thermally at a later point in time.

Depending on the selection of the material of the carrier body 1 and on the desired optical properties of the optoelectronic component, in addition to its principal constituent of the epoxy resin specified above, the filling material 3 contains further components in order to set the strength of connection to the material of the carrier body, the time of incipient curing and final curing, the optical transparency, the refractive index, the temperature stability, the mechanical hardness, etc. as desired.

A method for producing the above-described optoelectronic component in accordance with the present invention is explained below with the aid of the schematic illustration of FIG. 2.

The first step is to encapsulate the conductor ribbon 5 by injection molding with the aid of the high temperature resistant thermoplastic in order to form the carrier body 1. Either simultaneously with this operation, or in a subsequent method step, there is formed in the carrier body 1 a central recess 1A at whose base surface the conductor ribbon 5 lies exposed for making contact. The receiver or transmitter, for example an LED 2, is arranged in this recess 1A, and electrically connected to the conductor ribbons 5 in the usual way, such as with bond wires or chip bonding.

Subsequently, a defined quantity of the above-described transparent and flowable filling material 3 is filled into the recess 1A in order to embed the transmitter or receiver 2 therein. In the exemplary embodiment illustrated in FIGS. 1 and 2, the quantity of the filling material 3 to be filled in is dimensioned such that the surface 3B averted from the embedded transmitter or receiver 2 is aligned with the surface 1 of the carrier body 1B, that is to say in other words the recess 1A is completely filled with the flowable filling material 3.

A punch 8 is now pressed onto the surface 3B of the still flowable filling material 3, as indicated by the arrow in FIG. 2. The punch 8 in this case has a punch face 8A, which corresponds to a desired lens shape 7 that is to be impressed onto the surface 3B of the filling material 3. In the exemplary embodiment of FIGS. 1 and 2, the lens shape 7 is illustrated schematically as a Fresnel lens; however, the invention is not restricted to this specific lens shape.

The punch 8 with the punch face 8A is preferably produced from a transparent material such as glass or plastic, for example. It is possible in this way to use a suitable radiation source 9 to apply UV or optical radiation through the punch 8 to the surface 3B of the filling material 3 made from the cationically curable, UV-initiated or light-initiated material while the punch 8 is being pressed onto the surface 3B of the filling material 3 to form the lens profile 7, in order to incipiently cure or prefix the surface 3B with the lens profile 7 formed in this state. After a period of approximately 0.1 to 5 seconds, the lens profile 7 is already adequately fixed.

Subsequently, the punch 8 is lifted off from the incipiently cured surface 3B of the filling material 3. In order to facilitate this operation, at least the punch face 8A of the punch 8 advantageously has a coating made from a transparent material with properties that are non-stick with reference to the filling material 3.

In a further method step, the incipiently cured filling material 3 with the prefixed lens profile is completely cured, for example at a temperature of over 100° C.

A separate method step for applying a lens is rendered superfluous in the above-described method owing to the lens profile being directly impressed onto the surface of the filling material. Moreover, the impressing operation is relatively simple and unproblematical while simultaneously ensuring a sufficiently high accuracy of fit.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. An optoelectronic component, comprising:
   a carrier body with a recess;
   an optoelectronic transmitter or receiver arranged in the recess on the carrier body; and
   a filling which is made from a transparent material and embeds the optoelectronic transmitter or receiver in the recess of the carrier body,
   wherein a surface, averted from the transmitter or receiver, of the filling is designed with a lens profile, and
   wherein said surface, averted from the transmitter or receiver, of the filling does not protrude substantially from a surface, averted from the transmitter or receiver, of the carrier body.

2. The optoelectronic component as claimed in claim 1, wherein the surface, averted from the transmitter or receiver, of the filling is substantially aligned with the surface, averted from the transmitter or receiver, of the carrier body.

3. The optoelectronic component as claimed in claim 1, wherein the lens profile is designed in the form of a Fresnel lens.

4. The optoelectronic component as claimed in claim 1, wherein the material of the filling is a transparent, cationically curable, UV-initiated or light-initiated material.

5. The optoelectronic component as claimed in claim 4, wherein the material of the filling contains a cationically curable, UV-initiated or light-initiated epoxy resin.

6. A method for producing an optoelectronic component having a carrier body with a recess and an optoelectronic transmitter or receiver arranged in the recess on the carrier body, the method comprising the steps of:
   forming the recess in the carrier body;
   mounting the transmitter or receiver in the recess thus formed;
   filling a defined quantity of a transparent filling material into the recess for the purpose of embedding the transmitter or receiver;
   impressing a lens profile on a surface, averted from the transmitter or receiver, of the transparent filling material; and
   curing the transparent filling material having the surface having the lens profile.

7. The method as claimed in claim 6, wherein the lens profile is impressed on the surface, averted from the transmitter or receiver, of the transparent filling material by means of a punch which has a punch face corresponding to the lens profile.

8. The method as claimed in claim 7, wherein the punch face of the punch corresponds to the profile of a Fresnel lens.

9. The method as claimed in claim 7, wherein the step of impressing the lens profile has the following substeps:
   pressing the punch with the punch face onto said surface of the transparent filling material to form the lens profile corresponding to the punch face;
   incipiently curing the transparent filling material having the lens profile thus formed; and
   lifting the punch off from the incipiently cured transparent filling material.

10. The method as claimed in claim 9, wherein at least the punch face of the punch has a coating made from a material that has non-stick properties with reference to the filling material.

11. The method as claimed in claim 9, wherein the punch comprises a transparent material, the filling material comprises a transparent, cationically curable, UV-initiated or light-initiated material, and the step of incipiently curing the filling material having the lens profile is performed by applying UV or light radiation through the punch to the filling material.

12. The method as claimed in claim 11, wherein the step of incipiently curing the filling material having the lens profile is performed by means of a UV flash.

13. The method as claimed in claim 11, wherein the filling material contains a cationically curable, UV-initiated or light-initiated epoxy resin.

* * * * *